(12) United States Patent
Mukaiyama

(10) Patent No.: US 7,042,754 B2
(45) Date of Patent: May 9, 2006

(54) FERROELECTRIC MEMORY DEVICE AND ELECTRONIC APPARATUS

(75) Inventor: Fumiaki Mukaiyama, Nagano (JP)

(73) Assignee: Seiko Epson Corporation, (JP)

(*) Notice: Subject to any disclaimer, the term of this patent is extended or adjusted under 35 U.S.C. 154(b) by 0 days.

(21) Appl. No.: 11/076,291

(22) Filed: Mar. 9, 2005

(65) Prior Publication Data
US 2005/0201137 A1   Sep. 15, 2005

(30) Foreign Application Priority Data
Mar. 15, 2004  (JP) ............................. 2004-071985

(51) Int. Cl.
G11C 11/22  (2006.01)

(52) U.S. Cl. .................. 365/145; 365/149; 365/202; 365/203; 365/207

(58) Field of Classification Search ................ 365/145, 365/149, 202, 203, 207
See application file for complete search history.

(56) References Cited

U.S. PATENT DOCUMENTS

| | | | |
|---|---|---|---|
| 5,978,250 A * | 11/1999 | Chung et al. | 365/145 |
| 6,278,630 B1 | 8/2001 | Yamada | |
| 6,493,251 B1 * | 12/2002 | Hoya et al. | 365/145 |
| 2002/0080642 A1 * | 6/2002 | Sadayuki | 365/145 |
| 2003/0174573 A1 * | 9/2003 | Suzuki et al. | 365/230.03 |
| 2004/0052122 A1 * | 3/2004 | Kato et al. | 365/200 |

FOREIGN PATENT DOCUMENTS

JP    11-191295    7/1999

* cited by examiner

Primary Examiner—Richard Elms
Assistant Examiner—Toan Le
(74) Attorney, Agent, or Firm—Harness, Dickey & Pierce, P.L.C.

(57) ABSTRACT

A ferroelectric memory device equipped with a plate line control section that selects a specified plate line that is connected to a specified memory cell, thereby discharging a data accumulation charge to a specified bit line connected to the specified memory cell, and discharges a reference accumulation charge to the specified bit line when the specified bit line is discharged; a device that, by successively connecting the specified bit line to a first sense amplifier line and a second sense amplifier line based on a change in the potential on the specified plate line, retains at the first sense amplifier line a potential on the specified bit line when the data accumulation charge is discharged, and retains at the second sense amplifier line a potential on the specified bit line when the reference accumulation charge is discharged; and a sense amplifier that judges the predetermined data based on potentials on the first sense amplifier line and the second sense amplifier line.

8 Claims, 3 Drawing Sheets

FERROELECTRIC MEMORY DEVICE AND ELECTRONIC APPARATUS

RELATED APPLICATIONS

This application claims priority to Japanese Patent Application No. 2004-071985 filed Mar. 15, 2004 which is hereby expressly incorporated by reference herein in its entirety.

BACKGROUND

1. Technical Field

The present invention relates to ferroelectric memories and electronic apparatuses.

2. Related Art

A conventional ferroelectric memory device is described in Japanese Laid-open patent application HEI 11-191295 (Patent Document 1). In the ferroelectric memory device described in Patent Document 1, reading operations are conducted twice for the same memory cell, a charge read out in the first time is assumed to be data, and a charge read out in the second time is assumed to be a reference, whereby a sense amplifier detects memory cell data.

However, in the conventional ferroelectric memory device described in the Patent Document 1, a sense amplifier needs to be provided for each of the bit lines, and therefore the number of sense amplifiers is considerably increased. As a result, there is a problem in that the circuit area of the ferroelectric memory device increases, and the power consumption increases.

Accordingly, it is an object of the present invention to provide ferroelectric memory devices and electronic apparatuses which can solve the problem described above. This object can be achieved by combining the characteristics set forth in the independent claims in the scope of patent claims. Also, the dependent claims further define advantageous concrete examples of the present invention.

SUMMARY

To solve the aforementioned problem, in accordance with a first embodiment of the present invention, there is provided a ferroelectric memory device characterized in comprising: a plurality of memory cells each having a ferroelectric capacitor that stores predetermined data; a plurality of word lines, a plurality of bit lines and a plurality of plate lines which are connected to each of the plurality of memory cells; a plate line control section that changes a potential on a specified one of the plate lines connected to a specified one of the memory cells, thereby discharging a data accumulation charge indicating the predetermined data accumulated in the specified one of the memory cells to a specified one of the bit lines connected to the specified one of the memory cells to thereby read out the predetermined data stored in the specified one of the memory cells, and discharges a reference accumulation charge that is a charge accumulated in the specified one of the memory cells from which the predetermined data is read out to the specified one of the bit lines; a first sense amplifier line and a second sense amplifier line; a bit line selection section that selects the specified one of the bit lines among the plurality of bit lines to be connected to the first sense amplifier line and the second sense amplifier line based on a change of the potential on the specified one of the plate lines; a bit line connection section that retains at the first sense amplifier line a potential on the specified one of the bit lines when the data accumulation charge is discharged by connecting the specified one of the bit lines to the first sense amplifier line, and retains at the second sense amplifier line a potential on the specified one of the bit lines when the reference accumulation charge is discharged by connecting the specified one of the bit lines to the second sense amplifier line; and a sense amplifier that judges the predetermined data stored in the specified one of the memory cells based on potentials on the first sense amplifier line and the second sense amplifier line.

With the structure described above, when a plate line is selected and a charge accumulated in a ferroelectric capacitor is discharged to a bit line, in other words, when data stored in the ferroelectric capacitor is read out, the bit line connection section connects the bit line to a first sense amplifier line to retain a potential on the bit line to the first sense amplifier line. In other words, the first sense amplifier retains a potential corresponding the data stored in the ferroelectric capacitor.

When a charge accumulated in a ferroelectric capacitor from which data has already been read out is discharged to a bit line, the bit line connection section connects the bit line to a second sense amplifier to retain a potential on the bit line to the second sense amplifier line. It is noted here that a potential to be retained at the second sense amplifier line is, for example, a potential that is generally equal to the potential on the bit line when data "0" stored in the ferroelectric capacitor is read out.

In other words, data stored in a specified ferroelectric capacitor is read out in a first reading operation, and an accumulated charge corresponding to the data (data accumulation charge) is retained at the first sense amplifier line; and in a second reading operation, an accumulated charge (reference accumulation charge) corresponding to data stored in the specified ferroelectric capacitor from which the data has been read out is retained at the second sense amplifier line. The reference accumulation charge discharged to the second sense amplifier line in the second reading operation includes a charge corresponding to data written in the ferroelectric capacitor by inverting the polarization of the ferroelectric capacitor in the first reading operation, and a charge corresponding to data retained at the ferroelectric capacitor through reading out the data that is stored in the ferroelectric capacitor without inverting the polarization of the ferroelectric capacitor in the first reading operation. Data corresponding to the reference accumulation charge may be "0" or "1."

Accordingly, with the structure described above, for example, based on a potential on a corresponding bit line when data "0" stored in a ferroelectric capacitor is read out, data stored in the ferroelectric capacitor can be judged. In other words, because a reference voltage for judging data stored in a ferroelectric capacitor can be generated by a self-reading operation, data stored in the ferroelectric capacitor can be accurately judged even when there is a manufacturing variation and/or a change with the lapse of time in the ferroelectric capacitor. Accordingly, a highly reliable ferroelectric capacitor device with extremely few malfunctions can be provided.

Also, in accordance with the structure described above, based on a potential on a plate line, a bit line to be connected to the first sense amplifier line and the second sense amplifier line is selected from among a plurality of bit lines, whereby a potential on the bit line is retained at the first sense amplifier line and the second sense amplifier line. Accordingly, with the structure described above, data stored in multiple ferroelectric capacitors can be read by a single sense amplifier, such that the number of sense amplifiers can be considerably reduced. As a consequence, a low-cost ferroelectric memory device with very low power consumption can be provided.

The ferroelectric memory device described above may preferably be further equipped with an offset voltage generation section that adds an offset voltage to the second sense amplifier line. The offset voltage generation section may preferably add the offset voltage to the second sense amplifier line when the second sense amplifier line retains the potential of the specified one of the bit lines discharged, and the sense amplifier may preferably judge the predetermined data based on a potential on the second sense amplifier line to which the offset voltage is added.

In accordance with the structure described above, an offset voltage is added to a potential on a bit line when a charge is discharged from a ferroelectric capacitor, thereby forming a reference voltage to be used when the sense amplifier judges data stored in the ferroelectric capacitor. Consequently, in accordance with the structure described above, due to the fact that a reference voltage is generated based on a charge discharged from a ferroelectric capacitor, data stored in the ferroelectric capacitor can be accurately judged even when there is a manufacturing variation and/or a change with the lapse of time in the ferroelectric capacitor.

In the ferroelectric memory device described above, the bit line connection section may preferably include a plurality of first MOS transistors provided between the plurality of bit lines and the first sense amplifier line, respectively, having gates connected to the plate lines corresponding to the bit lines, respectively, and a plurality of second MOS transistors provided between the plurality of bit lines and the second sense amplifier line, respectively, having gates connected to the plate lines corresponding to the bit lines, respectively.

According to the structure described above, with a very simple structure, a bit line to be connected to the first sense amplifier line and the second sense amplifier line can be readily selected from among multiple bit lines.

In the ferroelectric memory device described above, the bit line connection section may preferably include a plurality of third MOS transistors provided between the plurality of bit lines and the plurality of first MOS transistors, respectively, and a plurality of fourth MOS transistors provided between the plurality of bit lines and the plurality of second MOS transistors, respectively.

The ferroelectric memory device may preferably be further equipped with a write control section that controls a potential on the specified one of the bit lines based on a result of judgment of the data judged by the sense amplifier, thereby storing the data in the specified one of the memory cells connected to the specified one of the bit lines.

According to the structure described above, based on a result of judgment of data that is read out from a ferroelectric capacitor, the data is rewritten in the ferroelectric capacitor. Accordingly, when data is read out from a ferroelectric capacitor, and even if, for example, the data has been destroyed such as in a case where data different from the data has been written in the ferroelectric capacitor, the data can be securely rewritten.

The first sense amplifier line and the second sense amplifier line may preferably be disposed generally at right angles with respect to the bit lines.

With the structure described above, multiple bit lines disposed in a memory cell block can be readily connected to the first sense amplifier line and the second sense amplifier line.

In accordance with a second embodiment of the present invention, there is provided an electronic apparatus characterized in comprising the ferroelectric memory device described above. It is noted here that the electronic apparatus may generally refer to an apparatus that is equipped with a ferroelectric memory device in accordance with the present invention and has a predetermined function, without being limited to any particular structure, and includes all apparatuses that require memory devices, such as, for example, computer devices in general, cellular phones, PHSs, PDAs, electronic notebooks, IC cards, and the like, which are equipped with the ferroelectric memory devices described above.

DETAILED DESCRIPTION

The present invention is described below based on embodiments of the present invention with reference to the accompanying drawings. However, the embodiments described below do not in anyway limit the invention concerning the scope of patent claims, and all the combinations of the characteristics described in the embodiments would not necessarily be indispensable as the means for solution of the invention.

Figure 1:
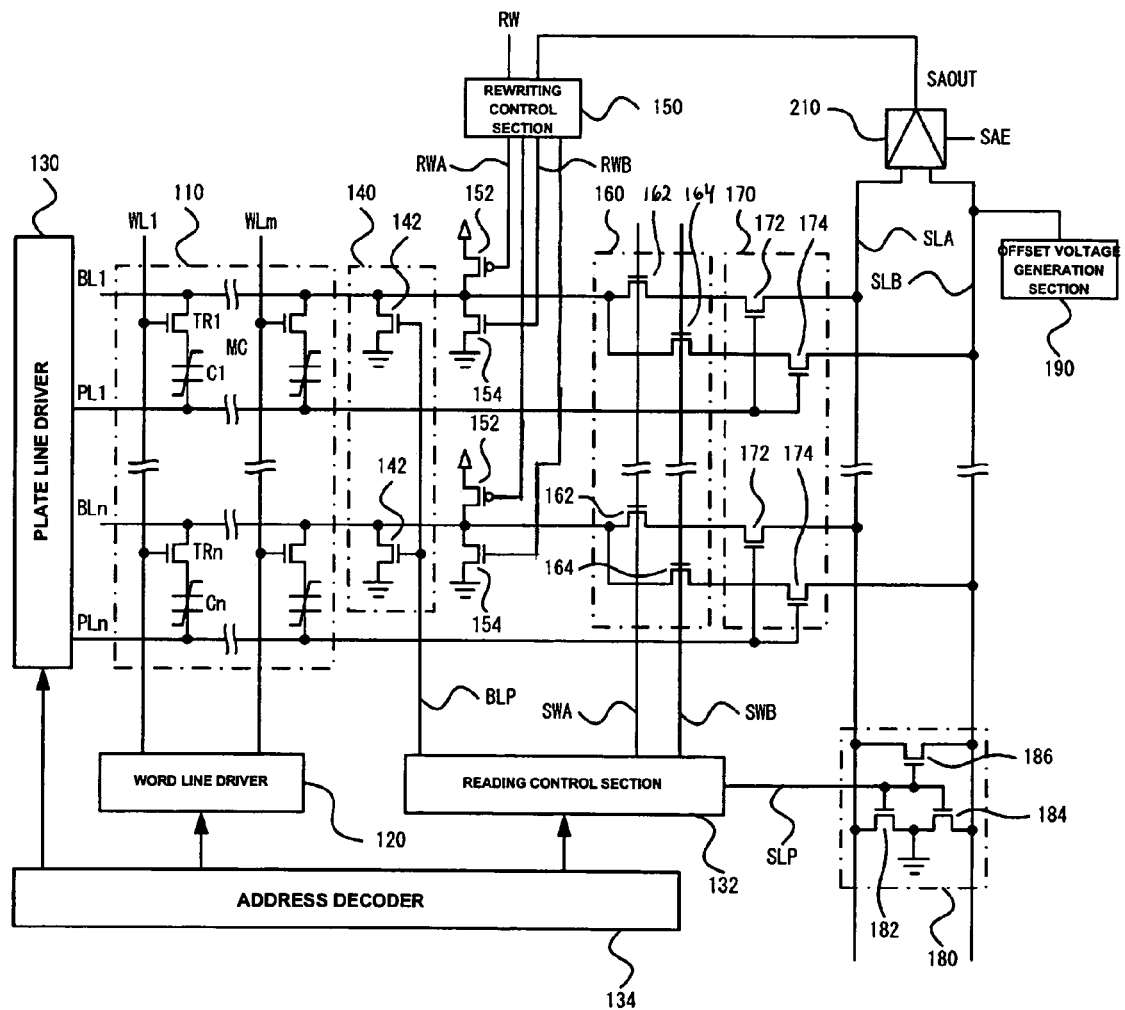
FIG. 1 is a diagram showing an example of the structure of a ferroelectric memory device 100 in accordance with an embodiment of the present invention.

FIG. 1 is a diagram showing an example of the structure of a ferroelectric memory device in accordance with an embodiment of the present invention. The ferroelectric memory device 100 is formed from a memory cell block 110, a word line driver 120, a plate line driver 130 that is one example of a plate line control section, a reading control circuit 132, an address decoder 134, a discharge section 140, a rewriting control section 150 that is one example of a writing control unit, a bit line connection section 160, a bit line selection section 170, a first sense amplifier line SLA and a second sense amplifier line SLB, a sense amplifier line discharge section 180, an offset voltage generation section 190, and a sense amplifier 210.

The memory cell block 110 is composed of a plurality of memory cells MC disposed in an array configuration, each having a ferroelectric capacitor C and an n-type MOS transistor TR. Also, the memory cell block 110 is provided with a plurality of word lines WL1–WLm (m is an integer of 2 or greater), a plurality of bit lines BL1–BLn (n is an integer of 2 or greater), and a plurality of plate lines PL1–PLn. In each of the memory cells MC, a gate of the n-type MOS transistor TR is connected to a predetermined word line WLi (i is an integer of 1–m), one end of the ferroelectric capacitor C is connected through the n-type MOS transistor TR to a predetermined bit line BLj (j is an integer of 1–n), and the other end of the ferroelectric capacitor C is connected to a predetermined plate line PLj (j is an integer of 1–n).

The address decoder 134 supplies, based on an address signal supplied from outside, a word line selection signal indicating a word line to be selected, and a plate line selection signal indicating a plate line to be selected, to the word line driver 120 and the plate line driver 130, respectively. Also, the address decoder 134 supplies to the reading control circuit 132 a control signal for controlling the discharge section 140 and the bit line connection section 160 in a reading operation to read data stored in a memory cell CM.

The word line driver 120 and the plate line driver 130 change potentials on a specified word line WLi and a specified plate line PLj based on the word line selection signal and the plate line selection signal, respectively, to thereby select the specified word line WLi and the specified plate line PLj.

The reading control circuit 132 controls operations of the discharge section 140 and the bit line connection section 160 based on control signals supplied from the address decoder 134. More specifically, the reading control circuit 132 controls potentials of a bit line pre-charge signal BLP to be supplied to the discharge section 140, and bit line connection control signals SWA and SWB to be supplied to the bit line connection section 160, thereby controlling operations of the discharge section 140 and the bit line connection section 160.

The discharge section 140 grounds each of the bit lines BLj based on a potential of BLP. The discharge section 140 is formed from n-type MOS transistors 142 each having a drain connected to each of the bit lines BLj, a source grounded, and a gate being supplied with BLP. The discharge section 140 can also function as a pre-charge section for pre-charging a bit line BLj by discharging the bit line BLj.

The bit line selection section 170 selects a bit line BLj to be connected to the first sense amplifier line SLA and the second sense amplifier SLB from among the bit lines BL1–BLn. The bit line selection section 170 is formed from n-type MOS transistors 172 and 174 provided between the bit lines BL1–BLn and the first sense amplifier line SLA and the second sense amplifier line SLB, respectively. Gates of the n-type MOS transistors 172 and 174 provided on the bit line BLj are connected to the plate line PLj, such that the n-type MOS transistors 172 and 174 place the bit line BLj in a state connectable to the first sense amplifier line SLA and the second sense amplifier line SLB based on a potential on the plate line PLj. In other words, among the bit lines BL1–BLn, a bit line BLj whose corresponding plate line PLj is selected is placed in a state connectable to the first sense amplifier line SLA and the second sense amplifier line SLB.

The bit connection section 160 connects the bit lines BL1–BLn to one of the first sense amplifier line SLA and the second sense amplifier line SLB. The bit line connection section 160 is formed from an n-type MOS transistor 162 provided between each of the bit lines BL1–BLn and the first sense amplifier line SLA, and an n-type MOS transistor 164 provided between each of the bit lines BL1–BLn and the second sense amplifier line SLB. The control signal SWA is supplied to a gate of the n-type MOS transistor 162, and the control signal SWB is supplied to a gate of the n-type MOS transistor 164, such that the n-type MOS transistor 162 and the n-type MOS transistor 164 connects corresponding one of the bit lines BL1–BLn to one of the first sense amplifier line SLA and the second sense amplifier line SLB, based on potentials of SWA and SWB, respectively.

In accordance with the present embodiment, the bit line connection section 160 connects a selected bit line BLj and the first sense amplifier SLA, thereby retaining to the first sense amplifier line SLA a potential on the bit line BLj when data stored in the ferroelectric capacitor C is read out, in other words, when an accumulated charge in the ferroelectric capacitor C is discharged. Also, the bit line connection section 160 connects the bit line BLj and the second sense amplifier SLB, thereby retaining to the second sense amplifier line SLB a potential on the bit line BLj that is discharged.

The sense amplifier line discharge section 180 discharges the first sense amplifier line SLA and the second sense amplifier line SLB based a sense amplifier line pre-charge signal SLP. The sense amplifier line discharge section 180 is formed from n-type MOS transistors 182, 184 and 186. The n-type MOS transistor 182 is provided between the first sense amplifier line SLA and the second sense amplifier line SLB, and brings the first sense amplifier line SLA and the second sense amplifier line SLB to the same potential. The n-type MOS transistors 182 and 184 have drains that are connected to the first sense amplifier line SLA or the second sense amplifier line SLB, respectively, and sources grounded, and ground the first sense amplifier line SLA and the second sense amplifier line SLB based on a potential of SLP.

The offset voltage generation section 190 adds an offset voltage to the second sense amplifier line SLB. The offset voltage generation section 190 is, for example, a constant voltage circuit that generates a constant voltage.

The sense amplifier 210 is connected to the first sense amplifier line SLA and the second sense amplifier line SLB, and judges data stored in the ferroelectric capacitor C based on potentials on the first sense amplifier line SLA and the second sense amplifier line SLB.

In accordance with the present embodiment, the sense amplifier 210 uses a potential on the second sense amplifier line SLB with an offset voltage added as a reference, and detects a potential on the first sense amplifier line SLA which is a potential on the bit line BLj when an accumulated charge of the ferroelectric capacitor C is discharged, to thereby judge data stored in the ferroelectric capacitor C. Also, the sense amplifier 210 outputs a sense amplifier output signal SAOUT indicating a judgment result of the data.

The first sense amplifier line SLA and the second sense amplifier line SLB are disposed generally at right angles with respect to the bit lines BL1–BLn. In the present embodiment, one pair of the first sense amplifier line SLA and the second sense amplifier line SLB is provided for one memory cell block 110, in other words, one sense amplifier 210 is provided for one memory cell block 110. However, another example may have a structure in which one memory cell block 110 is divided into a plurality of regions, and one pair of the first sense amplifier line SLA and the second sense amplifier line SLB is provided for each of the regions. One memory cell block 110 may be, for example, a block that includes a plurality of memory cells MC which are controlled by one word line driver 120 and one plate line driver 130.

The rewriting control section 150 controls a potential on each of the bit lines BL1–BLn in order to rewrite data that has been read out from a ferroelectric capacitor C in the ferroelectric capacitor C. Each of the bit lines BL1–BLn is connected to drains of a p-type MOS transistor 152 having a source to which VCC is supplied and an n-type MOS transistor 154 having a source that is grounded. The rewriting control section 150 controls a potential on a bit line BLj that is connected to a memory cell MC from which data is read out based on potentials of the SAOUT received as an input and a rewriting control signal RW, to thereby rewrite the data in the memory cell MC (ferroelectric capacitor C).

Figure 2:
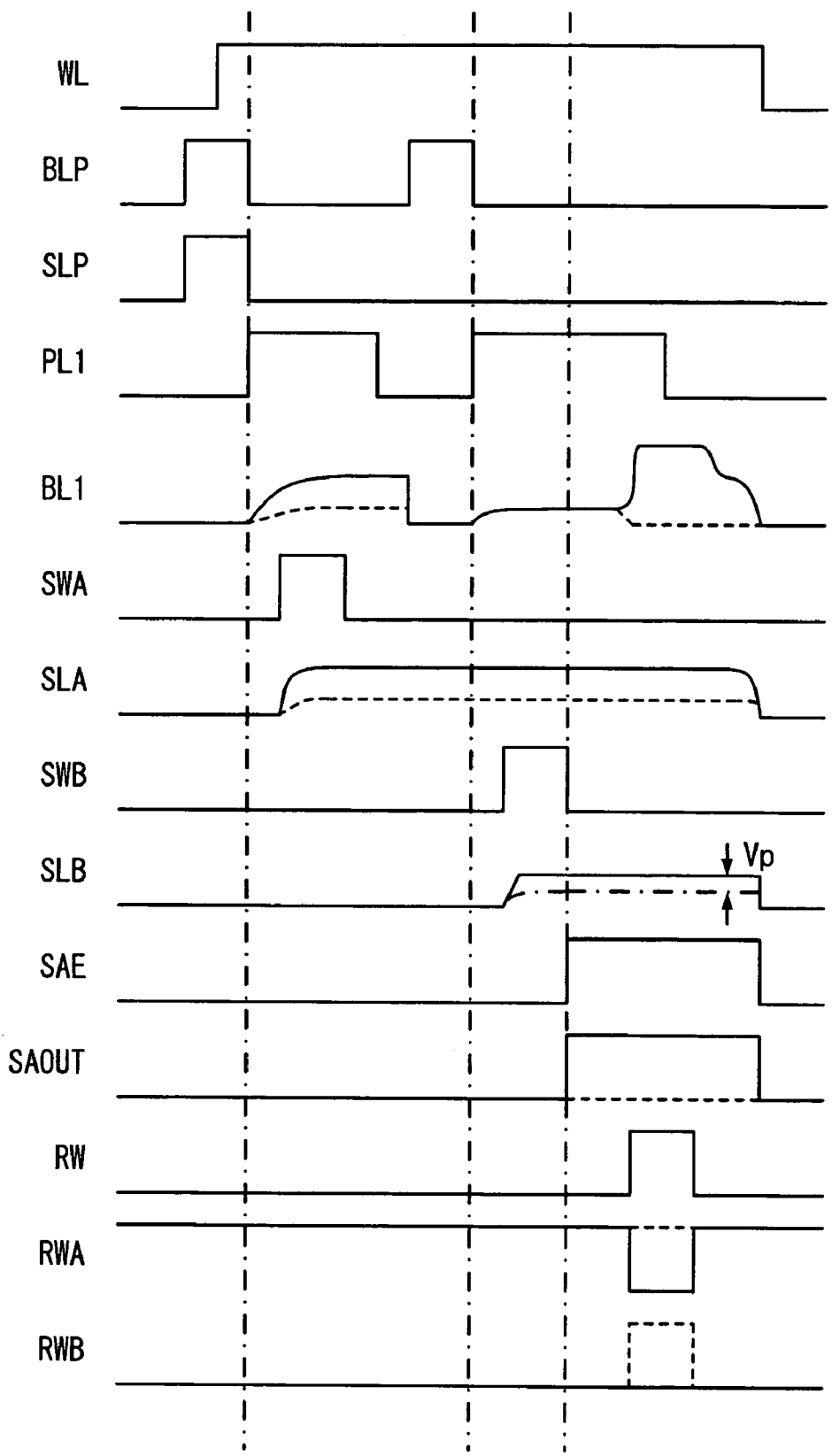
FIG. 2 is a timing chart indicating operations of the ferroelectric memory device 100 in accordance with the present embodiment.

FIG. 2 is a timing chart indicating operations of the ferroelectric memory device 100 in accordance with the present embodiment. Referring to FIG. 1 and FIG. 2, operations of the ferroelectric memory device 100 are described. In FIG. 2, in a period indicated by both of a solid line and a dotted line, the solid line indicates when data stored in a ferroelectric capacitor C is "1" and the dotted line indicates when the data is "0."

First, in a cycle I, the reading control circuit 132 changes the potentials of BLP and SLP to VCC, whereby the bit lines BL1–BLn as well as the first sense amplifier line SLA and the second sense amplifier line SLB are discharged. After discharging the bit lines BL1–BLn, the first sense amplifier line SLA and the second sense amplifier line SLB, the reading control circuit 132 brings the potential of BLP and SLP to 0V to place the bit lines BL1–BLn, the first sense amplifier line SLA and the second sense amplifier line SLB in a floating state.

Then, in a cycle II, the plate line driver 130 changes the potential on the bit line BL1 from 0V to VCC. As a result, based on data stored in a ferroelectric capacitor C, an accumulated charge is discharged from the ferroelectric capacitor C to the bit line BL1, such that the potential on the bit line BL1 changes based on the data.

More specifically, when "1" is stored in the ferroelectric capacitor C, the polarization of the ferroelectric capacitor C inverts, and therefore a change in the polarization that occurs with the inversion is large. Accordingly, a large accumulated charge is discharged from the ferroelectric capacitor C to the bit line BL1, and the potential on the bit line BL1 considerably rises.

On the other hand, when "0" is stored in a ferroelectric capacitor C, the polarization of the ferroelectric capacitor C does not invert, and therefore a change in the polarization is small. Accordingly, an accumulated charge that is discharged from the ferroelectric capacitor C to the bit line BL1 is small compared to the case where data "1" is stored in the ferroelectric capacitor C, and therefore the potential on the bit line BL1 does not rise very much.

Also, when the potential on the plate line PL1 changes from 0V to VCC, the n-type MOS transistors 172 and 174 become conductive, such that the bit line BL1 is placed in a state connectable to the first sense amplifier line SLA and the second sense amplifier line SLB.

Then, the reading control circuit 132 changes the potential of SWA from 0V to VCC, thereby connecting the bit line BL1 and the first sense amplifier line SLA. As a result, the potential on the first sense amplifier line SLA that has been in a floating state is brought to a potential that is generally equal to the potential on the bit line BL1. Then, the reading control circuit 132 changes the potential of SWA from VCC to 0V to electrically cut off the bit line BL1 from the first sense amplifier line SLA, such that the potential on the bit line BL1 at the time when data stored in the ferroelectric capacitor C is read out is retained at the first sense amplifier line SLA.

Then, the plate line driver 130 changes the potential on the plate line PL1 from VCC to 0V, thereby bringing the potential on the plate line PL1 to 0V. Also, the reading control circuit 132 changes the potential of BLP from 0V to VCC, whereby a reference accumulation charge is stored in the ferroelectric capacitor C as data "0."

Next, in a cycle III, after the reading control circuit 132 puts the bit line BL1 in a floating state again, the plate line driver 130 changes the potential on the plate line PL1 from 0V to VCC, whereby the accumulated charge in the ferroelectric capacitor C is discharged to the bit line BL1. At this moment, because data "0" is stored in the ferroelectric capacitor C, the change in the polarization of the ferroelectric capacitor C is small, and the accumulated charge discharged from the ferroelectric capacitor C to the bit line BL1 is small. Accordingly, the potential on the bit line BL1 rises to a potential that is generally equal to the potential on the bit line BL1 as in the case when the accumulated charge based on data "0" is discharged from the ferroelectric capacitor C in the cycle II.

Next, the reading control circuit 132 changes the potential of SWB from 0V to VCC, thereby connecting the bit line BL1 to the second sense amplifier line SLB. As a result, the potential on the second sense amplifier line SLB that has been in a floating state is brought to a potential that is generally equal to the potential on the bit line BL1. Then, the reading control circuit 132 changes the potential of SWA from VCC to 0V to electrically cut off the bit line BL1 from the second sense amplifier line SLB, such that the potential on the bit line BL1 which is generally equal to the potential at the time of reading out data "0" from the ferroelectric capacitor C is retained at the second sense amplifier line SLB.

Also, the offset voltage generation section 190 generates an offset voltage Vp, and adds the offset voltage Vp to the second sense amplifier line SLB. In other words, the potential on the second sense amplifier line SLB rises to a potential that is the potential on the bit line BL1 plus the offset voltage Vp. The offset voltage Vp is set such that, when the offset voltage Vp is added to the potential on the second sense amplifier line SLB, the potential on the second sense amplifier line SLB after the addition becomes to be a potential between the potential on the first sense amplifier line SLA when data "1" is read from the ferroelectric capacitor C and the potential on the second sense amplifier line SLB when data "0" is read out from the ferroelectric capacitor C.

It is noted here that the reference accumulation charge is not limited to storing data "0" as described above, but may be formed to use data "1." In this case, the offset voltage Vp is formed in a manner that a voltage generated by reducing the Vp as being a negative voltage becomes to be a reference potential. When data "0" is used as a reference accumulation charge, and when data stored in the ferroelectric capacitor C in the cycle II is "0," a charge read out therefrom can be used as a reference accumulation charge.

Next, in a cycle IV, data stored in the ferroelectric capacitor C is judged. First, the potential on SAE changes from 0V to VCC, and the sense amplifier 210 becomes to be an operable state. When the sense amplifier 210 becomes to be an operable state, the sense amplifier 210 compares the first sense amplifier line SLA and the second sense amplifier line SLB, and outputs SAOUT that is a result of the comparison as a judgment result given by judging the data stored in the ferroelectric capacitor C.

In the present embodiment, the first sense amplifier line SLA retains a potential on the bit line BL1 at the time when the data stored in the ferroelectric capacitor C is read out. Also, the second sense amplifier line SLB retains a potential that is the potential on the bit line BL1 when data is read out from the ferroelectric capacitor C plus the offset voltage VP, after data stored in the ferroelectric capacitor C has been read out, and the bit line BL1 has been discharged. Then, the sense amplifier 210 compares the potential retained at the second sense amplifier line SLB as a reference voltage with the potential on the first sense amplifier line SLA, thereby judging data stored in the ferroelectric capacitor C.

Concretely, when the potential on the first sense amplifier line SLA is higher than the potential on the second sense amplifier line SLB, the sense amplifier 210 judges that the data stored in the ferroelectric capacitor C is "1," and outputs a logical H (voltage VCC) as SAOUT. On the other hand, when the potential on the first sense amplifier line SLA is lower than the potential on the second sense amplifier line SLB, the sense amplifier 210 judges that the data stored in the ferroelectric capacitor C is "0," and outputs a logical L (voltage 0V) as SAOUT.

Next, in the ferroelectric capacitor C from which data is read out, the rewriting control section 150 rewrites the data based on SAOUT and the rewriting control signal RW. More specifically, when SAOUT indicates a logical H, in other words, when it is judged that data stored in the ferroelectric capacitor C is "1," the rewriting control section 150 brings the potential of RWA to 0V to thereby elevate the potential on the bit line BL1 to VCC while RW indicates a logical H. Also, the plate line driver 130 changes the potential on the plate line PL1 from VCC to 0V. As a result, a voltage of +VCC with the plate line PL1 as a reference is added to the ferroelectric capacitor C, such that data "1" is rewritten in the ferroelectric capacitor C.

On the other hand, when SAOUT indicates a logical L, in other words, when it is judged that data stored in the ferroelectric capacitor C is "0," the rewriting control section 150 brings the potential of RWB to VCC to thereby bring the potential on the bit line BL1 to 0V while RW indicates a logical H. As a result, a voltage of −VCC with the plate line PL1 as a reference is added to the ferroelectric capacitor C, such that data "0" is rewritten in the ferroelectric capacitor C. Also, because the voltage impressed to the ferroelectric capacitor C is generally zero after the plate line driver 130 has changed the potential on the plate line PL1 from VCC to 0V, the ferroelectric capacitor C retains data "0" that is rewritten. By the operations described above, data stored in the ferroelectric capacitor C can be read out, and the data read out can be rewritten in the ferroelectric capacitor C.

Figure 3:
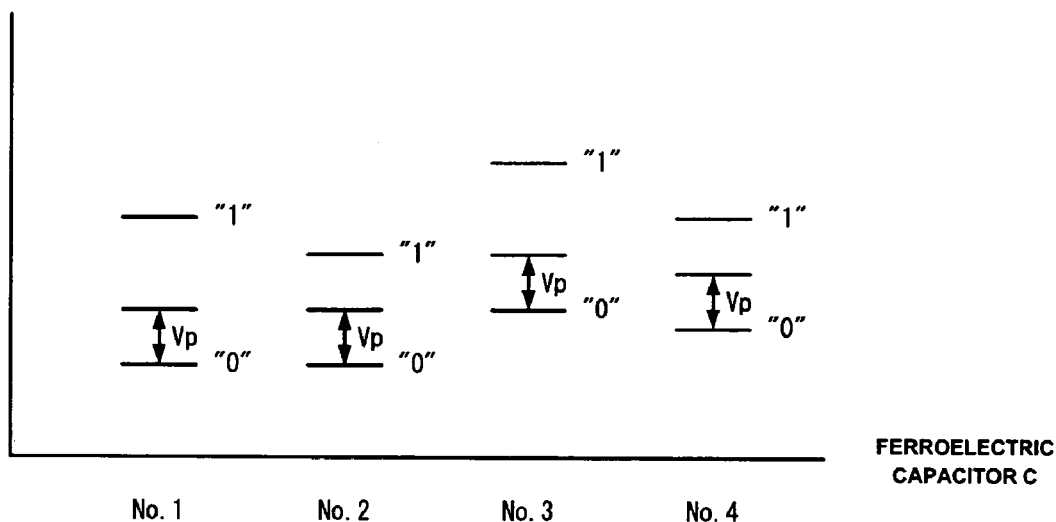
FIG. 3 is a diagram indicating relations between potentials on a bit line when data is read out from a ferroelectric capacitor and reference voltages.

In accordance with the present embodiment, for example, based on a potential on a bit line BLj when data "0" stored in a ferroelectric capacitor C is read out, the data stored in the ferroelectric capacitor C can be judged. In other words, as shown in FIG. 3, a reference voltage for judging data stored in a ferroelectric capacitor can be generated by a self-reading operation, data stored in the ferroelectric capacitor can be accurately judged even when there is a manufacturing variation and/or a quality change over time in the ferroelectric capacitor. As a result, a highly reliable ferroelectric memory device that has very few malfunctions can be provided.

Also, in accordance with the present embodiment, a bit line BLj to be connected to the first sense amplifier line SLA and the second sense amplifier line SLB is selected from among many bit lines, for example, the bit lines BL1–BLn, based on a potential on a plate line PLj, whereby the potential on the bit line BLj is retained at the first sense amplifier line SLA and the second sense amplifier line SLB. Accordingly, in accordance with the present embodiment, data stored in many ferroelectric capacitors C can be read by one sense amplifier 210, such that the number of sense amplifiers 210 can be considerably reduced. As a consequence, a low-cost ferroelectric memory device with extremely small power consumption can be provided.

Figure 4:
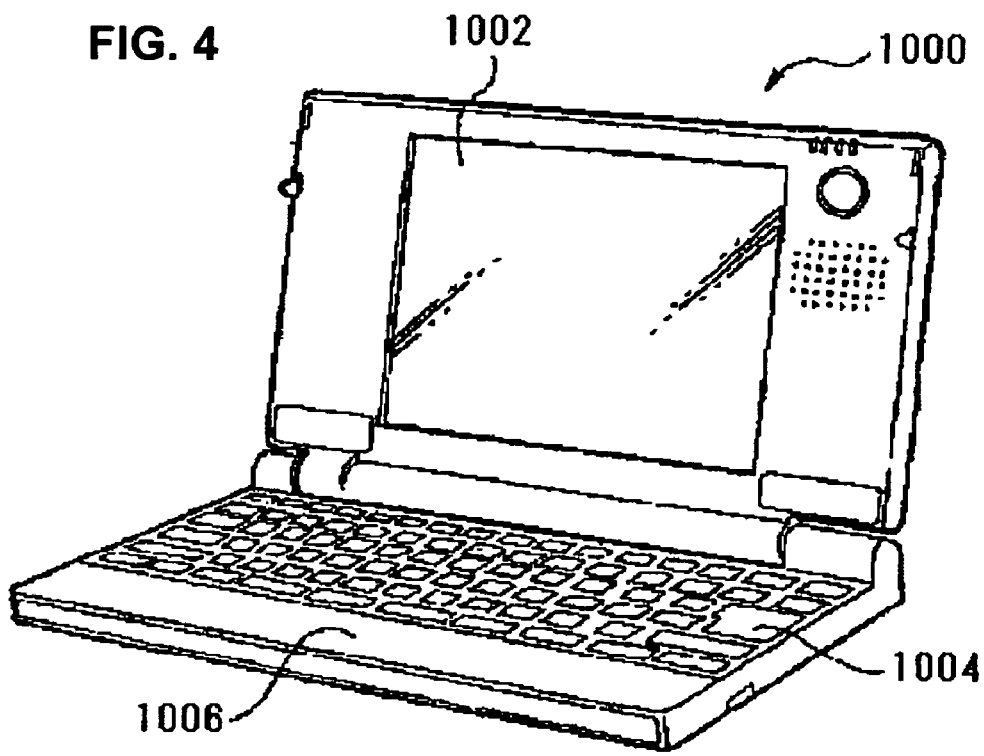
FIG. 4 is a perspective view showing the structure of a personal computer 1000, which is an example of an electronic apparatus in accordance with the present invention.

FIG. 4 is a perspective view showing a structure of a personal computer 1000, which is an example of an electronic apparatus in accordance with the present invention. In FIG. 4, the personal computer 1000 has a structure equipped with a display panel 1002 and a main body 1006 having a keyboard 1004. As storage medium, and in particular, as a nonvolatile memory of the main body 1004 of the personal computer 1000, a semiconductor device equipped with a storage circuit in accordance with the present invention is used.

The embodiment examples and application examples described above with reference to the embodiments of the present invention may be appropriately combined depending on the usages, or may be used with changes and/or improvements added thereto. The present invention is not limited to the descriptions of the embodiments above. It is clear from the description in the scope of patent claims that modes created by such combinations, changes and/or improvements can be included in the technical scope of the present invention.

What is claimed is:

1. A ferroelectric memory device comprising:
   a plurality of memory cells each having a ferroelectric capacitor that stores predetermined data;
   a plurality of word lines, a plurality of bit lines and a plurality of plate lines which are connected to each of the plurality of memory cells;
   a plate line control section that changes a potential on a specified one of the plate lines connected to a specified one of the memory cells, thereby discharging a data accumulation charge indicating the predetermined data accumulated in the specified one of the memory cells to a specified one of the bit lines connected to the specified one of the memory cells to thereby read out the predetermined data stored in the specified one of the memory cells, and discharges a reference accumulation charge that is a charge accumulated in the specified one of the memory cells from which the predetermined data is read out to the specified one of the bit lines;
   a first sense amplifier line and a second sense amplifier line;
   a bit line selection section that selects the specified one of the bit lines among the plurality of bit lines to be connected to the first sense amplifier line and the second sense amplifier line based on a change of the potential on the specified one of the plate lines;
   a bit line connection section that retains at the first sense amplifier line a potential on the specified one of the bit lines when the data accumulation charge is discharged by connecting the specified one of the bit lines to the first sense amplifier line, and retains at the second sense amplifier line a potential on the specified one of the bit lines when the reference accumulation charge is discharged by connecting the specified one of the bit lines to the second sense amplifier line; and
   a sense amplifier that judges the predetermined data stored in the specified one of the memory cells based on potentials on the first sense amplifier line and the second sense amplifier line.

2. A ferroelectric memory device according to claim 1, further comprising an offset voltage generation section that adds an offset voltage to the second sense amplifier line.

3. A ferroelectric memory device according to claim 2, wherein the offset voltage generation section adds the offset voltage to the second sense amplifier line when the second sense amplifier line retains the potential of the specified one of the bit lines discharged, and the sense amplifier judges the predetermined data based on a potential on the second sense amplifier line to which the offset voltage is added.

4. A ferroelectric memory device according to claim 1, wherein the bit line connection section includes:
- a plurality of first MOS transistors provided between the plurality of bit lines and the first sense amplifier line, respectively, having gates connected to the plate lines corresponding to the bit lines, respectively; and
- a plurality of second MOS transistors provided between the plurality of bit lines and the second sense amplifier line, respectively, having gates connected to the plate lines corresponding to the bit lines, respectively.

5. A ferroelectric memory device according to claim 1, wherein the bit line connection section includes:
- a plurality of third MOS transistors provided between the plurality of bit lines and the plurality of first MOS transistors, respectively; and
- a plurality of fourth MOS transistors provided between the plurality of bit lines and the plurality of second MOS transistors, respectively.

6. A ferroelectric memory device according to claim 1, further comprising a write control section that controls a potential on the specified one of the bit lines based on a result of judgment of the data judged by the sense amplifier, thereby storing the data in the specified one of the memory cells connected to the specified one of the bit lines.

7. A ferroelectric memory device according to claim 1, wherein the first sense amplifier line and the second sense amplifier line are disposed generally at right angles with respect to the bit lines.

8. An electronic apparatus comprising the ferroelectric memory device according to claim 1.

* * * * *